(12) United States Patent
Dai

(10) Patent No.: US 10,763,842 B1
(45) Date of Patent: Sep. 1, 2020

(54) RADIO FREQUENCY SWITCHING CIRCUIT

(71) Applicant: Shanghai Huahong Grace Semiconductor Manufacturing Corporation, Shanghai (CN)

(72) Inventor: Ruofan Dai, Shanghai (CA)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/428,269

(22) Filed: May 31, 2019

(30) Foreign Application Priority Data

Feb. 14, 2019 (CN) .......................... 2019 1 0114122

(51) Int. Cl.
*H03K 17/687* (2006.01)
*H03K 17/06* (2006.01)

(52) U.S. Cl.
CPC ......... *H03K 17/063* (2013.01); *H03K 17/687* (2013.01); *H03K 2217/0054* (2013.01)

(58) Field of Classification Search
CPC .............. H03K 17/063; H03K 17/687; H03K 2217/0054
USPC ....................................................... 327/434
See application file for complete search history.

(56) References Cited

U.S. PATENT DOCUMENTS

| | | | | | |
|---|---|---|---|---|---|
| 8,922,268 | B2* | 12/2014 | Madan | .................. | H03K 17/162 |
| | | | | | 327/427 |
| 9,160,328 | B2* | 10/2015 | Altunkilic | ............ | H03K 17/161 |
| 9,628,075 | B2* | 4/2017 | Cebi | .................... | H03K 17/687 |
| 9,893,722 | B2* | 2/2018 | Mokalla | ........... | H03K 17/04106 |
| 9,941,347 | B2* | 4/2018 | Shapiro | ................. | H01L 27/027 |
| 10,147,724 | B2* | 12/2018 | Madan | ................ | H01L 27/1203 |
| 10,396,772 | B2* | 8/2019 | Shanjani | .......... | H03K 17/04123 |
| 2019/0386005 | A1* | 12/2019 | Madan | .................... | H01L 23/66 |
| 2020/0044642 | A1* | 2/2020 | Shanjani | .......... | H03K 17/04123 |

* cited by examiner

*Primary Examiner* — Ryan Jager
(74) *Attorney, Agent, or Firm* — Harness, Dickey & Pierce, P.L.C.

(57) ABSTRACT a radio frequency (RF) switching circuit, including: a conducting module, configured to conduct an RF signal; a gate control voltage generating module, configured to provide a gate control voltage for the conducting module to control the conducting module operating at ON-state or OFF-state; wherein the gate control voltage generating module further includes: a first resistance adaptive module, providing a first impedance in a first state for a series branch where the conducting module and the gate control voltage generation module locate, and a second impedance in a second state for the series branch where the conducting module and the gate control voltage generation module locate, wherein the first impedance is greater than the second impedance. FOM is improved comprehensively, and Ron, Coff, and a power breakdown performance are optimized, which further improves circuit performance and reduces cost.

14 Claims, 6 Drawing Sheets

RADIO FREQUENCY SWITCHING CIRCUIT

CROSS-REFERENCE TO RELATED APPLICATIONS

This application claims the benefit of priority to Chinese Patent Application No. 201910114122.6, filed on Feb. 14, 2019. The entire contents of this application are hereby incorporated herein by reference.

TECHNICAL FIELD

The present disclosure relates to the field of electrical technology, and more particularly, to a radio frequency (RF) switching circuit.

BACKGROUND

An RF switch is one of the control devices for controlling an RF signal transmission path and an RF signal size, which is widely used in many fields such as wireless communication field, electrical countermeasures, radar systems, and electrical measuring instruments. It is well known that a design of an RF switch structure is critical to performance characteristics such as an on-resistance (Ron), an off-capacitance (Coff), a Figure of Merit (FOM), and a breakdown voltage.

In an existing RF switching circuit, the resistance of a common bias resistor may affect circuit performances such as Ron, Coff, FOM, and the breakdown voltage. As the resistance of the common bias resistor increases, Ron and breakdown voltage improve, but Coff and FOM deteriorate, which may affect an isolation and high-frequency application of the RF switching circuit; As the resistance of the common bias resistor decrease, Coff and FOM improve, but Ron and the breakdown voltage deteriorate, which may affect an insertion loss and a power capability of the RF switching circuit.

Therefore, a new RF switching circuit is needed to improve various performance indexes of the RF switching circuit synthetically.

SUMMARY

The present disclosure provides an RF switching circuit, including: a conducting module, configured to conduct an RF signal; a gate control voltage generating module, configured to provide a gate control voltage for the conducting module to control the conducting module operating at ON-state or OFF-state; wherein the gate control voltage generating module further includes: a first resistance adaptive module, providing a first impedance in a first state for a series branch where the conducting module and the gate control voltage generation module locate, and a second impedance in a second state for the series branch where the conducting module and the gate control voltage generation module locate, wherein the first impedance is greater than the second impedance, the first resistance adaptive module is in the first state when the RF signal operated by the conducting module is a high power signal or the conducting module is turned on, and the first resistance adaptive module is in the second state when the conducting module does not operate the high power signal and the conducting module is turned off.

In some embodiments, the gate control voltage generating module further includes a first level shifter circuit and a first filter circuit, wherein the first level shifter circuit and the first filter circuit are respectively configured to perform a level shifting on the first control voltage and to filter the level shifted voltage.

In some embodiments, the first resistance adaptive module includes: a first NOR gate, including a first input end, a second input end and an output end, wherein the first input end is configured to receive the first control voltage, the second input end is configured to receive a high power enable signal, and the output end is configured to output the resistance adaptive control signal; a first adaptive switch, configured to receive the resistance adaptive control signal, wherein the first adaptive switch is configured to turn on when the resistance adaptive control signal is high, and turn off when the resistance adaptive control signal is low; and a first common bias resistor, coupled in parallel with the first adaptive switch.

In some embodiments, the first resistance adaptive module includes: a first NOR gate, including a first input end, a second input end and an output end, wherein the first input end is configured to receive the first control voltage, the second input end is configured to receive a high power enable signal, and the output end is configured to output a resistance adaptive control signal; and a first NMOS transistor, including a gate, wherein the gate is configured to receive the resistance adaptive control signal.

In some embodiments, the RF switching circuit further includes: a body control voltage generating module, configured to provide a body control voltage for the conducting module to control the conducting module operating at ON-state or OFF-state; wherein the body control voltage generating module includes: a second resistance adaptive module, in series with the conducting module to form a series branch, and providing a first impedance for the series branch in the first state and a second impedance for the series branch in the second state, wherein the first impedance is greater than the second impedance, the second resistance adaptive module is in the first state when the RF signal operated by the conducting module is a high power signal or the conducting module is turned on, and the second resistance adaptive module is in the second state when the conducting module does not operate the high power signal and the conducting module is turned off.

In some embodiments, the body control voltage generating module further includes a second level shifter circuit and a second filter circuit, wherein the second level shifter circuit and the second filter circuit are respectively configured to perform a level shifting on the second control voltage and to filter the level shifted voltage.

In some embodiments, the second resistance adaptive module includes: a second NOR gate, including a first input end, a second input end and an output end, wherein the first input end is configured to receive a second control voltage, the second input end is configured to receive a high power enable signal, and the output end is configured to output the resistance adaptive control signal; a second adaptive switch, configured to receive the resistance adaptive control signal, wherein the second adaptive switch turns on when the resistance adaptive control signal is high, and turns off when the resistance adaptive control signal is low; and a second common bias resistor, coupled in parallel with the second adaptive switch.

In some embodiments, the second resistance adaptive module includes: a second NOR gate, including a first input end, a second input end and an output end, wherein the first input end is configured to receive the second control voltage, the second input end is configured to receive a high power enable signal, and the output end is configured to output a resistance adaptive control signal; and a second NMOS transistor, including a gate, wherein the gate is configured to receive the resistance adaptive control signal.

In some embodiments, the conducting module includes a multi-stage of stack cascaded conducting units, and each conducting unit includes a transistor.

In some embodiments, the conducting unit includes: a switching NMOS transistor, including a drain and a source, wherein the drain is configured to receive an RF input signal or coupled with a source of a switching NMOS transistor in another conducting unit in the conducting module, and the source is configured to output an RF output signal or coupled with a drain of the switching NMOS transistor in another conducting unit in the conducting module; or the source is configured to receive the RF input signal or coupled with the drain of the switching NMOS transistor in another conducting unit in the conducting module, and the drain is configured to output the RF output signal or coupled with a source of a switching NMOS transistor in another conducting unit in the conducting module; a path resistance, including one end coupled with the drain of the switching NMOS transistor, and the other end coupled with the source of the switching NMOS transistor; a gate bias resistor, including one end coupled with the gate control voltage generating module and the other end coupled with a gate of the switching NMOS transistor; and a body bias resistor, including one end coupled with the body control voltage generating module and the other end coupled with a substrate of the switching NMOS transistor.

In some embodiments, the conducting unit includes: a switching NMOS transistor, including a drain and a source, wherein the drain is configured to receive an RF input signal or coupled with a source of a switching NMOS transistor in other conducting units in the conducting module, and the source outputs an RF output signal or coupled with a drain of the switching NMOS transistor in another conducting unit in the conducting module; or the source is configured to receive the RF input signal or coupled with the drain of the switching NMOS transistor in other conducting units in the conducting module, and the drain is configured to output the RF output signal or coupled with a source of a switching NMOS transistor in another conducting unit in the conducting module; a path resistance, including one end coupled with the drain of the switching NMOS transistor, and the other end coupled with the source of the switching NMOS transistor; a gate bias resistor, including one end coupled with the gate control voltage generating module and the other end coupled with a gate of the switching NMOS transistor; and a body bias diode, including a positive electrode coupled with a substrate of the switching NMOS transistor and a negative electrode coupled with the gate of the switching NMOS transistor.

Embodiments of the present disclosure have the following benefits.

In embodiments of the present disclosure, the gate control voltage generating module includes a first resistance adaptive module for providing a first impedance in a first state for a series branch where the conducting module and the gate control voltage generation module locate, and a second impedance in a second state for the series branch where the conducting module and the gate control voltage generation module locate, wherein the first impedance is greater than the second impedance, the first resistance adaptive module is in the first state when the RF signal operated by the conducting module is a high power signal or the conducting module is turned on, and the first resistance adaptive module is in the second state when the conducting module does not operate the high power signal and the conducting module is turned off. The impedance adaptation and power control selection introduced on the first common bias resistor improves FOM comprehensively, and optimizes Ron, Coff, and a power breakdown performance, which improves circuit performance and reduces cost.

DETAILED DESCRIPTION

Figure 1:
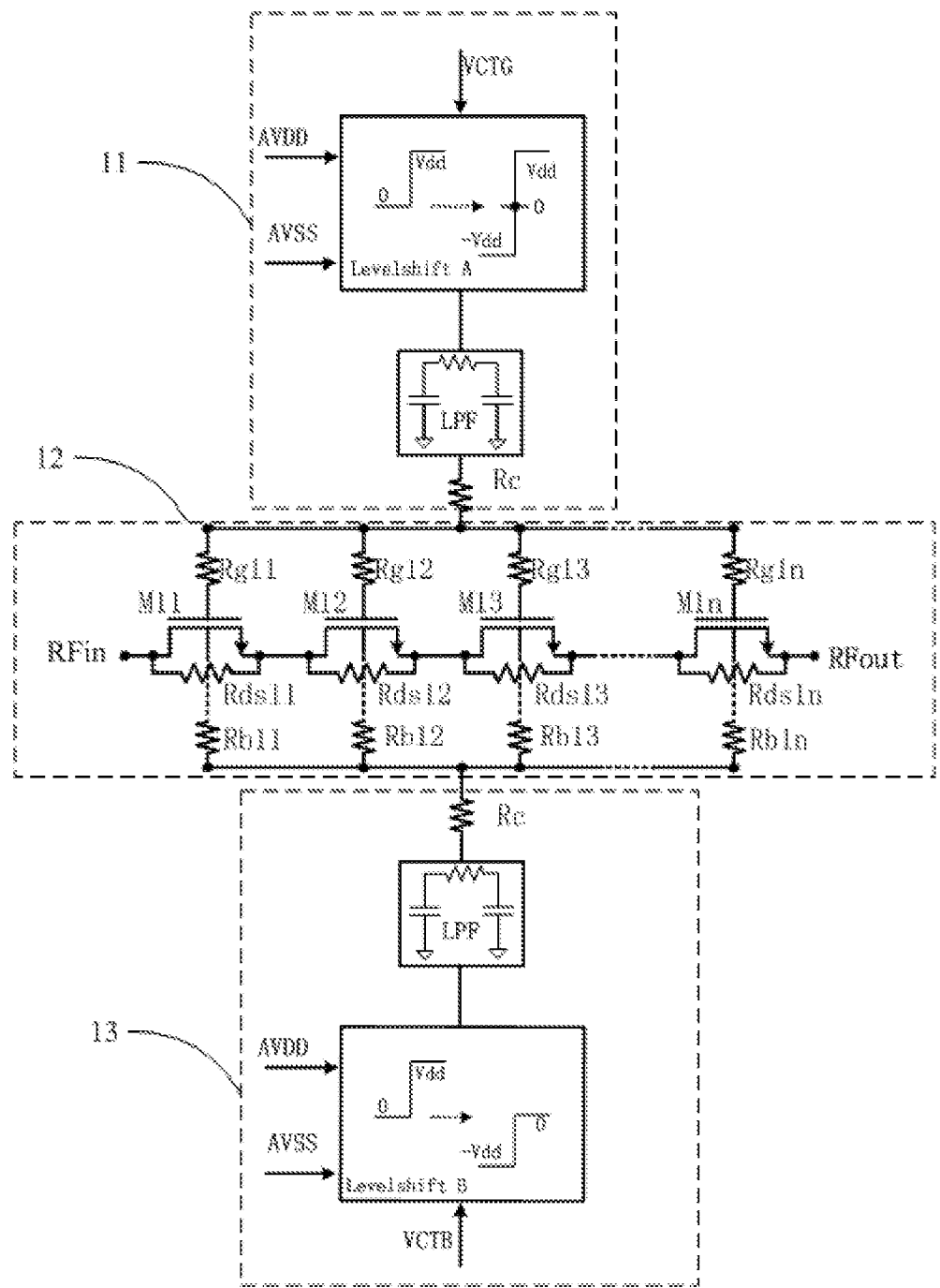
FIG. 1 schematically illustrates a structural diagram of an existing RF switching circuit.

Referring to FIG. 1, FIG. 1 schematically illustrates a structural diagram of an existing RF switching circuit.

The RF switching circuit as shown in FIG. 1 includes a gate control voltage generating module 11, a switching module 12, and a body control voltage generating module 13, and both the gate control voltage generating module 11 and the body control voltage generating module 13 includes a level shifter circuit, a filter LPF, and a common bias resistor Rc, and provide a gate control voltage and a body control voltage for the switching module 12 respectively. The switching module 12 includes a plurality of cascaded NMOS transistors M11, M12, M13, . . . , M1$n$, a plurality of gate bias resistors Rg11, Rg12, Rg13, . . . , Rg1$n$, a plurality of body bias resistors Rb11, Rb12, Rb13, . . . , Rb1$n$, and a plurality of path resistors Rds11, Rds12, Rds13, . . . , Rds1$n$.

Figure 2:
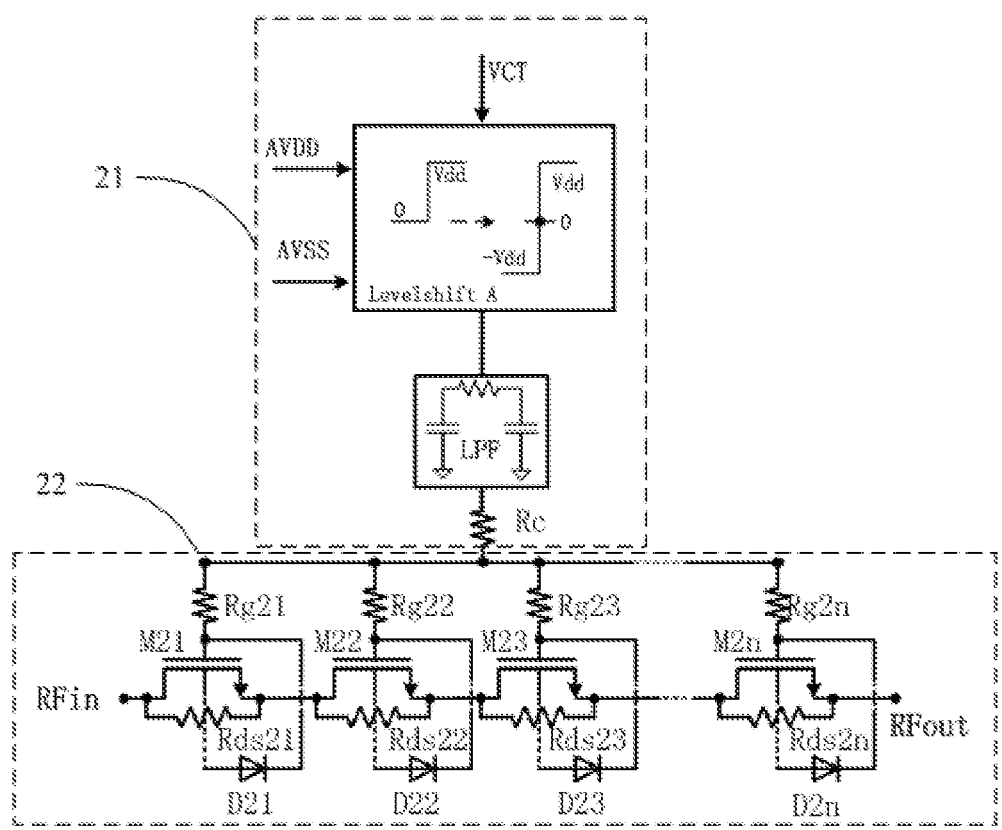
FIG. 2 schematically illustrates a structural diagram of an existing RF switching circuit.

Referring to FIG. 2, FIG. 2 schematically illustrates a structural diagram of an existing RF switching circuit.

Compared with the RF switching circuit shown in FIG. 1, the RF switch circuit shown in FIG. 2 includes only a gate control voltage generating module 21 and a switching module 22, wherein the switch module 22 includes a plurality of cascaded NMOS transistors M21, M22, M23, . . . , M2$n$, a plurality of gate bias resistors Rg21, Rg22, Rg23, . . . , Rg2$n$, a plurality of via resistors Rds21, Rds22, Rds23, . . . , Rds2$n$ and a plurality of diodes D21, D22, D23, . . . , D2$n$.

For the RF switching circuit shown in FIG. 1 and FIG. 2, as a resistance of the common bias resistor increases, Ron and breakdown voltage improve, but Coff and FOM deteriorate, which may affect a isolation and high-frequency application of the RF switching circuit; As a resistance of the common bias resistor decrease, Coff and FOM improve, but Ron and the breakdown voltage deteriorate, which may affect a insertion loss and a power capability of the RF switching circuit.

Figure 3:
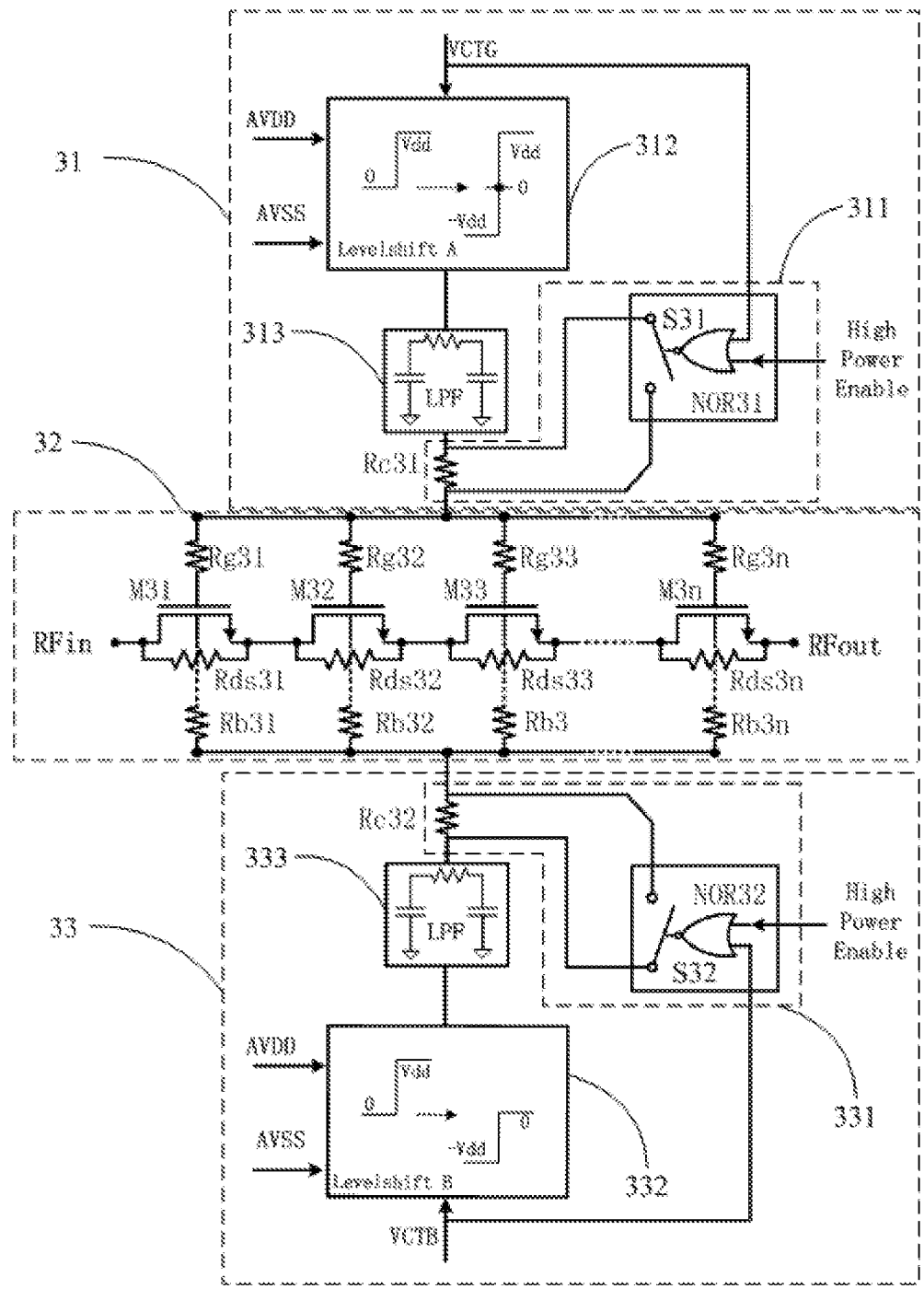
FIG. 3 schematically illustrates a structural diagram of an RF switching circuit according to an embodiment of the present disclosure.

Referring to FIG. 3, FIG. 3 schematically illustrates a structural diagram of an RF switching circuit according to an embodiment of the present disclosure.

The RF switching circuit shown in FIG. 3 includes a conducting module, configured to conduct an RF signal; a gate control voltage generating module 31, configured to provide a gate control voltage for the conducting module to control the conducting module operating at ON-state or OFF-state; and a body control voltage generating module 33, configured to provide a body control voltage for the conducting module to control the conducting module operating at ON-state or OFF-state. Specifically, the body control voltage generating module 33 assists the gate control voltage generating module 31 to control the conducting module 32, which improves the switching performance of the RF switching circuit.

In some embodiments, the gate control voltage generating module 31 includes a first resistance adaptive module 311. The first resistance adaptive module 311 provides a first impedance in a first state for a series branch where the conducting module 32 and the gate control voltage generation module 31 locate, and a second impedance in a second state for the series branch where the conducting module 32 and the gate control voltage generation module 31 locate, wherein the first impedance is greater than the second impedance, the first resistance adaptive module 311 is in the first state when the RF signal operated by the conducting module 32 is a high power signal or the conducting module 32 is turned on, and the first resistance adaptive module 311 is in the second state when the conducting module 32 does not operate the high power signal and the conducting module is turned off In some embodiments, the first resistance adaptive module 311 includes a first NOR gate NOR31, a first adaptive switch S31 and a first common bias resistor Rc31.

The first NOR gate NOR31 includes a first input end, a second input end and an output end, wherein the first input end is configured to receive the first control voltage VCTG, the second input end is configured to receive a high power enable HPE signal HPE, and the output end is configured to output a resistance adaptive control signal. The first adaptive switch S31 is configured to receive the resistance adaptive control signal, wherein the first adaptive switch turns on when the resistance adaptive control signal is high, and turns off when the resistance adaptive control signal is low. The first common bias resistor Rc31 is coupled in parallel with the first adaptive switch S31.

In some embodiments, if the conducting module 32 processes the high power signal, the high power enable signal HPE is 1; if the conducting module 32 does not process the high power signal, the high power enable signal HPE is 0. When the first control voltage VCTG is high, the conducting module 32 is turned on, and an input value of the first input end of the first NOR gate NOR31 is 1; when the first control voltage VCTG is low, the conducting module 32 is turned off, and the input value of the first input end of the first NOR gate NOR 31 is 0.

Therefore, the resistance adaptive control signal output from the first NOR gate NOR31 in the first state is a low level, the first adaptive switch S31 is turned on, the first common bias resistor Rc31 is connected to the circuit, and the first resistance adaptive module 311 provides a first impedance for a series branch where the conducting module 32 and the gate control voltage generating module 31 locate; the resistance adaptive control signal output from the first NOR gate NOR31 in the first state is a high level, the first adaptive switch S31 is turned off, the first common bias resistor Rc31 is shorted, and the first resistance adaptive module 311 provides a second impedance for a series branch where the conducting module 32 and the gate control voltage generating module 31 locate. The first impedance is greater than the second impedance.

In some embodiments, the RF switching circuit needs to conduct the RF signal when the conducting module 32 is turned on, which requires a low insertion loss, in other words, a low on-resistance; and the RF signal needs to isolate the RF signal when the conducting module 32 is turned off, which requires a low truncating capacitor. It should be noted that, when the high power enable signal HPE is 1, the conducting module 32 is in an off state, but the first resistance adaptive module 311 is still required to provide a high first impedance due to the need to isolate the high power signals of the other branches.

Based on the above design, when the RF switching circuit processes the high power signal, the first common bias resistor Rc31 is connected to the circuit to meet a breakdown voltage requirement of the circuit in high power applications; when the conducting module 32 is turned on, the first common bias resistor Rc31 is connected to the circuit to meet the requirement of the circuit for a low Ron when the RF switch is turned on; when the conducting module 32 is turned off, the first common bias resistor Rc31 is shorted to meets the requirement of the circuit for a low Coff when the RF switch is turned off, which improves the FOM of the circuit.

In some embodiments, the gate control voltage generating module 31 further includes a first level shifter circuit 312 and a first filter circuit 313, wherein the first level shifter circuit and the first filter circuit are respectively configured to perform a level shifting on the first control voltage and to filter the level shifted voltage.

In some embodiments, similar to the gate control voltage generating module 31, the body control voltage generating module 33 is configured to provide a body control voltage for the conducting module 32 to control the conducting module 32 operating at ON-state or OFF-state, and includes: a second resistance adaptive module 331, in series with the conducting module 32 to form a serious branch, and providing a first impedance for the series branch in the first state and a second impedance for the series branch in the second state, wherein the first impedance is greater than the second impedance, the second resistance adaptive module 331 is in the first state when the RF signal operated by the conducting module is a high power signal or the conducting module is turned on, and the second resistance adaptive module 331 is in the second state when the conducting module does not operate the high power signal and the conducting module is turned off.

Specifically, the second resistance adaptive module 331 includes: a second NOR gate NOR32, a second adaptive switch S32, and a second common bias resistor Rc32.

In some embodiments, the second NOR gate NOR 32 includes a first input end configured to receive a second control voltage VCTB, a second input end configured to receive the high power enable signal HPE, and an output end outputting a resistance adaptive control signal. The second adaptive switch S32 is configured to receive the resistance adaptive control signal, and turns on when the resistance adaptive control signal is at a high level, so the second common bias resistor Rc32 is shorted; the second adaptive switch S32 turns off when the resistance adaptive control signal is at a low level, so the second common bias resistor Rc32 is connected to the circuit. For more details about the second resistance adaptive module 331, reference may be made to the related description of the first resistance adaptive module 311, which is not described herein.

In some embodiments, the body control voltage generating module 33 further includes a second level shifter circuit 332 and a second filter circuit 333, wherein the second level shifter circuit 332 and the second filter circuit 333 are respectively configured to perform a level shifting on the second control voltage and to filter the level shifted voltage.

In some embodiments, the conducting module 32 includes a multi-stage of stack cascaded conducting units, and each conducting unit includes a transistor. Specifically, the transistor may be an NMOS transistor.

In some embodiments, the conducting module 32 includes a plurality of switching NOMS transistor (M31-M3n), a plurality of gate bias resistors (Rg31-Rg3n), a plurality of body bias resistors (Rb31-Rb3n), and a plurality of path resistors (Rds31-Rds3n).

In some embodiments, each conducting unit includes: a switching NMOS transistor, including a drain and a source, wherein the drain is configured to receive an RF input signal or coupled with a source of a switching NMOS transistor in another conducting unit in the conducting module 32, and the source is configured to output an RF output signal or coupled with a drain of the switching NMOS transistor in another conducting unit in the conducting module 32; in some embodiments, the source is configured to receive the RF input signal or coupled with the drain of the switching NMOS transistor in other conducting units in the conducting module, and the drain is configured to output the RF output signal or coupled with a source of a switching NMOS transistor in another conducting unit in the conducting module.

Each conducting unit further includes: a path resistance, including one end coupled with the drain of the switching NMOS transistor, and the other end coupled with the source of the switching NMOS transistor; a gate bias resistor, including one end coupled with the gate control voltage generating module 31 and the other end coupled with a gate of the switching NMOS transistor; and a body bias resistor, including one end coupled with the body control voltage generating module 33 and the other end coupled with a substrate of the switching NMOS transistor.

Figure 4:
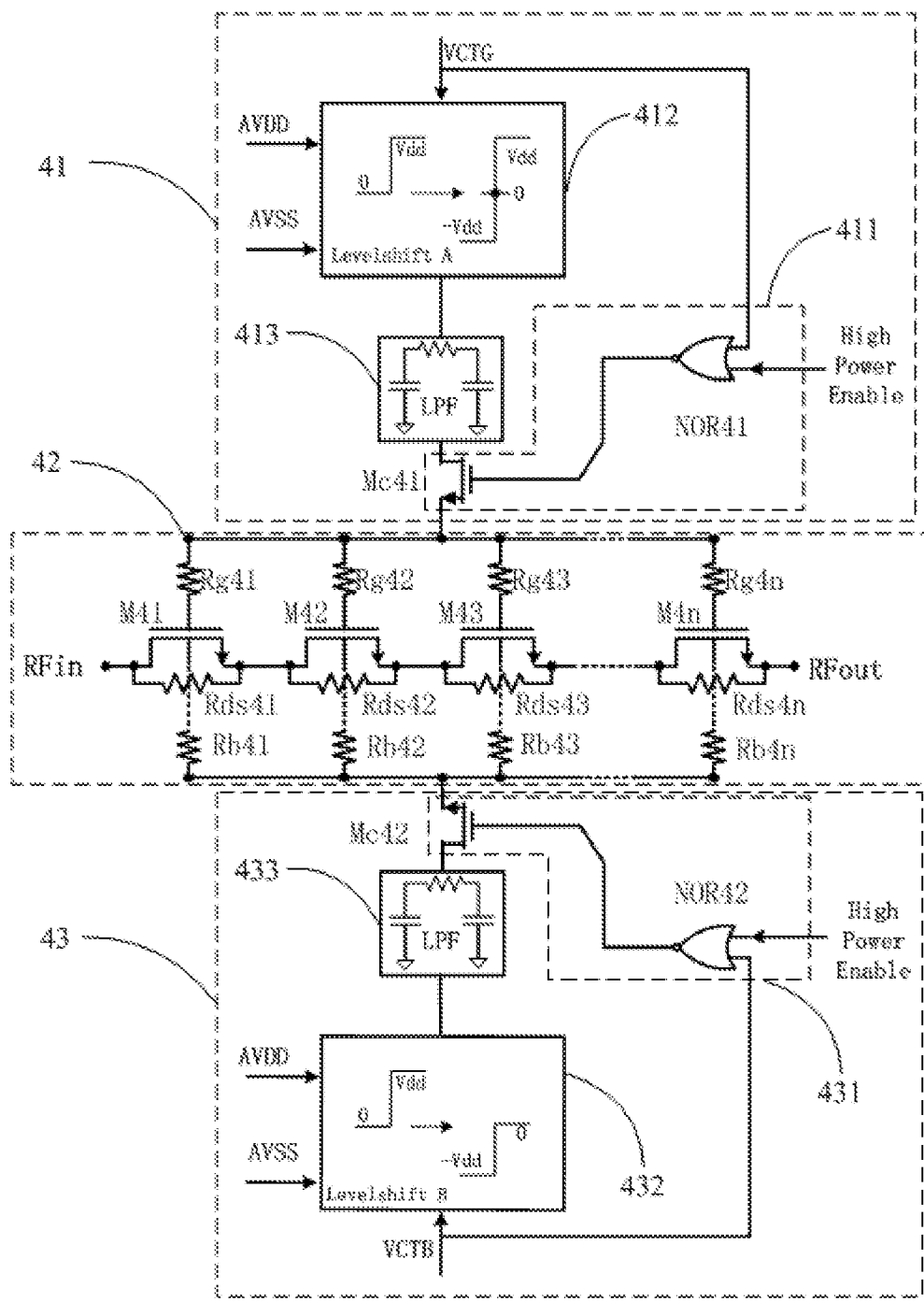
FIG. 4 schematically illustrates a structural diagram of an RF switching circuit according to an embodiment of the present disclosure.

Referring to FIG. 4, FIG. 4 schematically illustrates a structural diagram of an RF switching circuit according to an embodiment of the present disclosure.

The RF switching circuit shown in FIG. 4 includes a gate control voltage generating module 41, a conducting module 42 and a body control voltage generating module 43. The gate control voltage generating module 41 includes a first resistance adaptive module 411, a first level shifter circuit 412, and a first filter circuit 413. The body control voltage generating module 43 includes a second resistance adaptive module 431, a second level shifter circuit 432, and a second filter circuit 433.

In some embodiments, the conducting module 32 includes a multi-stage of stack cascaded conducting units, and each conducting unit includes a transistor. Specifically, the transistor may be an NMOS transistor.

In some embodiments, the conducting module 42 includes a plurality of NOMS tubes (M41-M4n), a plurality of gate bias resistors (Rg41-Rg4n), a plurality of body bias resistors (Rb41-Rb4n), and a plurality of path resistance (Rds41-Rds4n). For more details about the conducting unit in the conducting module 42, reference may be made to the above description of the conducting unit in the conducting module 32, and details are not described herein.

Compared with the RF switching circuit shown in FIG. 3, in the RF switching circuit shown in FIG. 4, the first resistance adaptive module 411 includes: a first NOR gate NOR41, including a first input end, a second input end and an output end, wherein the first input end is configured to receive the first control voltage, the second input end is configured to receive a high power enable signal, and the output end is configured to output a resistance adaptive control signal; and a first NMOS transistor Mc41, including a gate, wherein the gate is configured to receive the resistance adaptive control signal.

In some embodiments, if the conducting module 42 processes the high power signal, the high power enable signal HPE is 1; if the conducting module 42 does not process the high power signal, the high power enable signal HPE is 0. When the first control voltage VCTG is high, the conducting module 42 is turned on, and an input value of the first input end of the first NOR gate NOR31 is 1; when the first control voltage VCTG is low, the conducting module 42 is turned off, and the input value of the first input end of the first NOR gate NOR 31 is 0.

Therefore, the resistance adaptive control signal output from the first NOR gate NOR41 in the first state is a low level, the first NMOS transistor Mc41 is in a cutoff state, and the first resistance adaptive module 411 provides a first impedance for a series branch where the conducting module 42 and the gate control voltage generating module 41 locate; the resistance adaptive control signal output from the first NOR gate NOR31 in the first state is a high level, the first NMOS transistor Mc41 is in a conducting state, and the first resistance adaptive module 411 provides a second impedance for a series branch where the conducting module 42 and the gate control voltage generating module 41 locate. The first impedance is greater than the second impedance.

Therefore, in the embodiment, when the RF switching circuit processes the high power signal, the first NMOS transistor Mc41 is in the cutoff state, which is equivalent to a large resistance to meet a breakdown voltage requirement of the circuit in high power applications; when the conducting module 42 is turned on, the first NMOS transistor Mc41 is in the cutoff state, which is equivalent to a large resistance to meet the requirement of the circuit for a low Ron when the RF switch is turned on; when the conducting module 42 is turned off, the first NMOS transistor Mc41 is in the conducting state, which is equivalent to a large resistance, to meet the requirement of the circuit for a low Coff when the RF switch is turned off, which improves the FOM of the circuit.

In some embodiments, the second resistance adaptive module 431 includes: a second NOR gate NOR42, including a first input end for receiving the second control voltage VCTB, and a second input end for receiving the high power enable signal HPE, and an output end for outputting a resistance adaptive control signal; and a second NMOS transistor Mc42 including a gate for receiving the resistance adaptive control signal.

In some embodiments, the second NMOS transistor Mc42 is configured to receive the resistance adaptive control signal, and is in the conducting state when the resistance adaptive control signal is at a high level, and is in the cutoff state when the resistance adaptive control signal is at a low level. For more details about the second resistance adaptive module 431, reference may be made to the related description of the first resistance adaptive module 411, and details are not described herein again.

Figure 5:
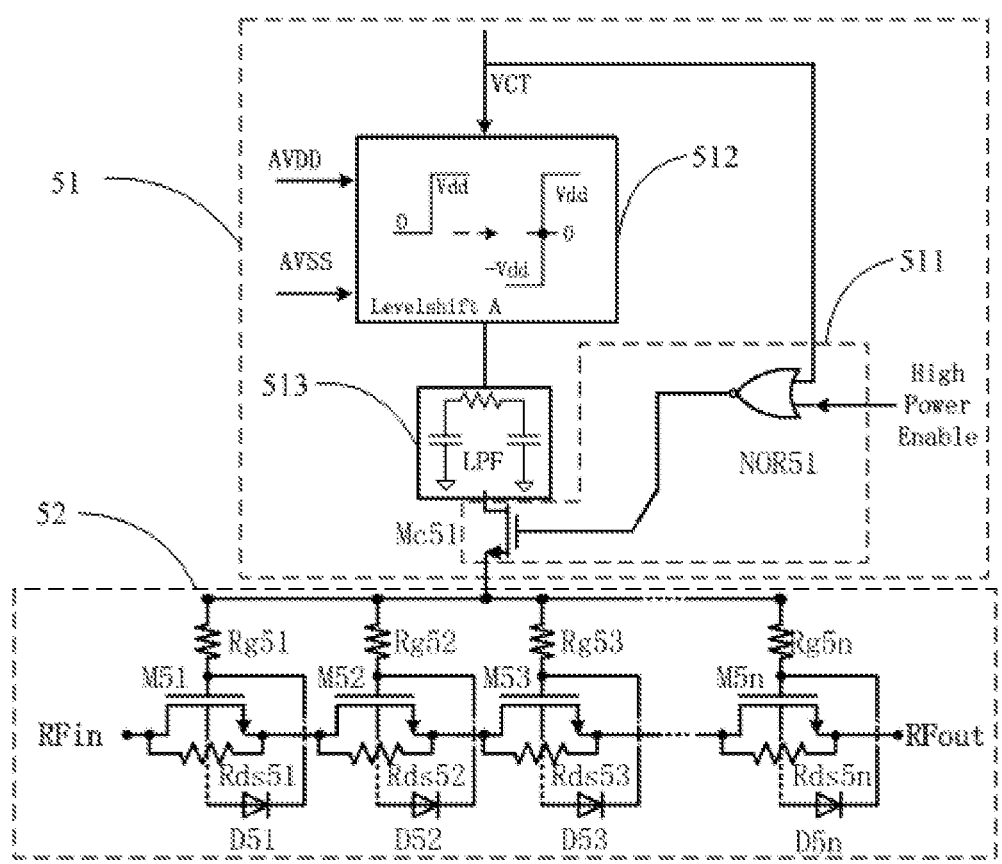
FIG. 5 schematically illustrates a structural diagram of an RF switching circuit according to an embodiment of the present disclosure.

Referring to FIG. 5, FIG. 5 schematically illustrates a structural diagram of an RF switching circuit according to an embodiment of the present disclosure.

Compared with the RF switching circuit shown in FIG. 4, the RF switching circuit shown in FIG. 5 only includes the gate control voltage generating module 51 and the conducting module 52. The gate control voltage generating module 51 includes a first resistance adaptive module 511, a first level shifter circuit 512, and a first filter circuit 513.

In some embodiments, the gate control voltage generating module 51 includes a first resistance adaptive module 511, a first level shifter circuit 512, and a first filter circuit 513. For more details about the gate control voltage generating module 51, reference may be made to the related description of the gate control voltage generating module 41, and details are not described herein again.

In some embodiments, the conducting module 52 includes a multi-stage of stack cascaded conducting units, and each conducting units includes a transistor. Specifically, the transistor may be an NMOS transistor.

In some embodiments, the conducting module 52 includes a plurality of NOMS tubes (M51-M5$n$), a plurality of gate bias resistors (Rg51-Rg5$n$), a plurality of body bias diodes (D51-D5$n$), and a plurality of path resistance (Rds51-Rds5$n$).

In some embodiments, each conducting unit includes: a switching NMOS transistor, including a drain and a source, wherein the drain is configured to receive an RF input signal or coupled with a source of a switching NMOS transistor in another conducting unit in the conducting module 52, and the source is configured to output an RF output signal or coupled with a drain of the switching NMOS transistor in another conducting unit in the conducting module 52; or the source is configured to receive the RF input signal or coupled with the drain of the switching NMOS transistor in other conducting units in the conducting module, and the drain is configured to output the RF output signal or coupled with a source of a switching NMOS transistor in another conducting unit in the conducting module; a path resistance, including one end coupled with the drain of the switching NMOS transistor, and the other end coupled with the source of the switching NMOS transistor; a gate bias resistor, including one end coupled with the gate control voltage generating module 51 and the other end coupled with a gate of the switching NMOS transistor; and a body bias diode, including a positive electrode coupled with a substrate of the switching NMOS transistor and a negative electrode coupled with the gate of the switching NMOS transistor.

Figure 6:
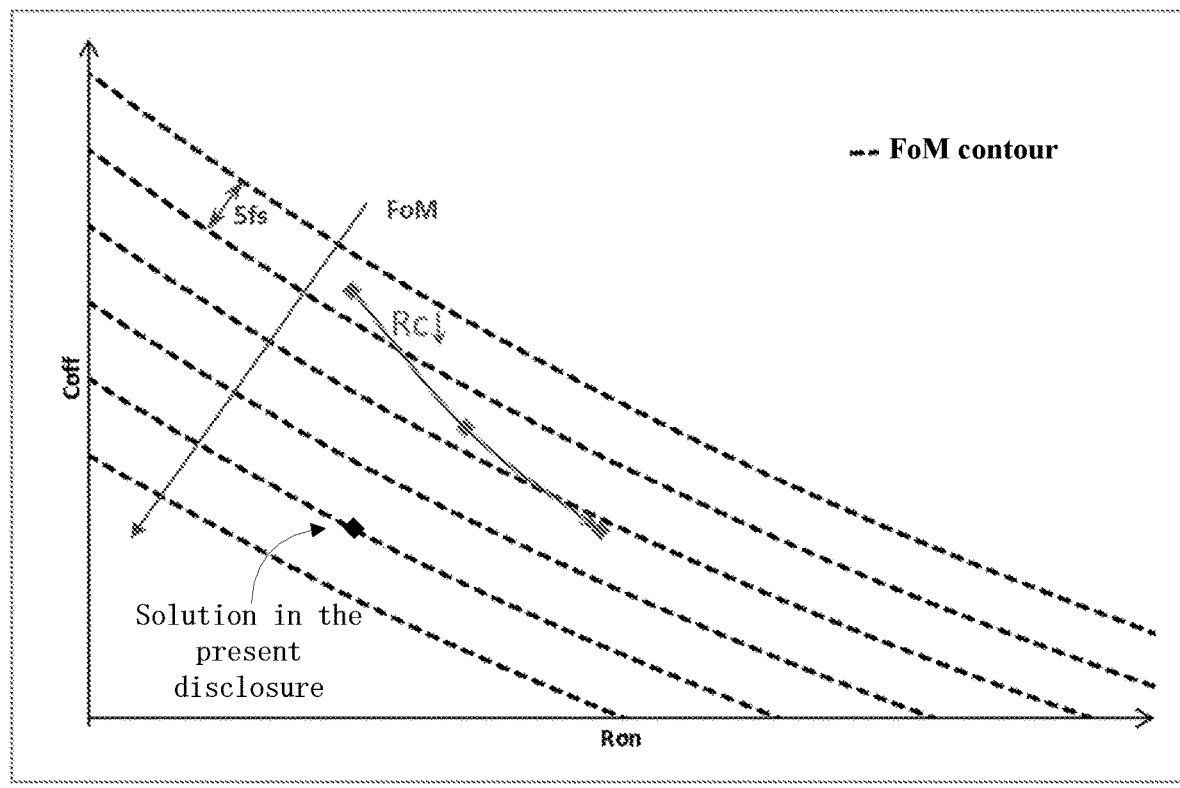
FIG. 6 schematically illustrates a structural diagram of an RF switching circuit according to an embodiment of the present disclosure.

Referring to FIG. 6, FIG. 6 schematically illustrates a structural diagram of an RF switching circuit according to an embodiment of the present disclosure.

As shown in FIG. 6, compared with the existing technology, the technical solution provided by the embodiment of the present disclosure can improve Coff while maintaining Ron, and can improve Ron while maintaining Coff. Therefore, the FOM may be comprehensively improved by 15%, which optimizes circuit performance and reduces costs.

Although the present disclosure has been disclosed above with reference to preferred embodiments thereof, it should be understood that the disclosure is presented by way of example only, and not limitation. Those skilled in the art may modify and vary the embodiments without departing from the spirit and scope of the present disclosure.

What is claimed is:

1. A radio frequency (RF) switching circuit comprising:
a conducting module, configured to conduct an RF signal; and
a gate control voltage generating module, configured to provide a gate control voltage for the conducting module to control the conducting module operating at ON-state or OFF-state;
wherein the gate control voltage generating module further comprises:
a first resistance adaptive module, providing a first impedance in a first state for a series branch where the conducting module and the gate control voltage generation module locate, and a second impedance in a second state for the series branch where the conducting module and the gate control voltage generation module locate, wherein the first impedance is greater than the second impedance, the first resistance adaptive module is in the first state when the RF signal operated by the conducting module is a high power signal or the conducting module is turned on, and the first resistance adaptive module is in the second state when the conducting module does not operate the high power signal and the conducting module is turned off.

2. The RF switching circuit according to claim 1, wherein the gate control voltage generating module further comprises a first level shifter circuit and a first filter circuit, wherein the first level shifter circuit and the first filter circuit respectively are configured to perform a level shifting on the first control voltage and to filter the level shifted voltage.

3. The RF switching circuit according to claim 1, wherein the first resistance adaptive module comprises:
a first NOR gate, comprising a first input end, a second input end and an output end, wherein the first input end is configured to receive the first control voltage, the second input end is configured to receive a high power enable signal, and the output end is configured to output the resistance adaptive control signal;
a first adaptive switch, configured to receive the resistance adaptive control signal, wherein the first adaptive switch is configured to turn on when the resistance adaptive control signal is high, and turn off when the resistance adaptive control signal is low; and
a first common bias resistor, coupled in parallel with the first adaptive switch.

4. The RF switching circuit according to claim 1, wherein the first resistance adaptive module comprises:
a first NOR gate, comprising a first input end, a second input end and an output end, wherein the first input end is configured to receive the first control voltage, the second input end is configured to receive a high power enable signal, and the output end is configured to output a resistance adaptive control signal; and
a first NMOS transistor, comprising a gate, wherein the gate is configured to receive the resistance adaptive control signal.

5. The RF switching circuit according to claim 1 further comprising:
a body control voltage generating module, configured to provide a body control voltage for the conducting module to control the conducting module operating at ON-state or OFF-state;
wherein the body control voltage generating module comprises:
a second resistance adaptive module, in series with the conducting module to form a series branch, and providing a first impedance for the series branch in the first state and a second impedance for the series branch in the second state, wherein the first impedance is greater than the second impedance, the second resistance adaptive module is in the first state when the RF signal operated by the conducting module is a high power signal or the conducting module is turned on, and the second resistance adaptive module is in the second state when the conducting module does not operate the high power signal and the conducting module is turned off.

6. The RF switching circuit according to claim 5, wherein the body control voltage generating module further comprises a second level shifter circuit and a second filter circuit, wherein the second level shifter circuit and the second filter circuit are respectively configured to perform a level shifting on the second control voltage and to filter the level shifted voltage.

7. The RF switching circuit according to claim 5, wherein the second resistance adaptive module comprises:
   a second NOR gate, comprising a first input end, a second input end and an output end, wherein the first input end is configured to receive a second control voltage, the second input end is configured to receive a high power enable signal, and the output end is configured to output the resistance adaptive control signal;
   a second adaptive switch, configured to receive the resistance adaptive control signal, wherein the second adaptive switch turns on when the resistance adaptive control signal is high, and turns off when the resistance adaptive control signal is low; and
   a second common bias resistor, coupled in parallel with the second adaptive switch.

8. The RF switching circuit according to claim 5, wherein the second resistance adaptive module comprises:
   a second NOR gate, comprising a first input end, a second input end and an output end, wherein the first input end is configured to receive the second control voltage, the second input end is configured to receive a high power enable signal, and the output end is configured to output a resistance adaptive control signal; and
   a second NMOS transistor, comprising a gate, wherein the gate is configured to receive the resistance adaptive control signal.

9. The RF switching circuit according to claim 5, wherein the conducting module comprises a multi-stage of stack cascaded conducting units, and each conducting unit comprises a transistor.

10. The RF switching circuit according to claim 9, wherein the conducting unit comprises:
    a switching NMOS transistor, comprising a drain and a source, wherein the drain is configured to receive an RF input signal or coupled with a source of a switching NMOS transistor in another conducting unit in the conducting module, and the source is configured to output an RF output signal or coupled with a drain of the switching NMOS transistor in another conducting unit in the conducting module; or the source is configured to receive the RF input signal or coupled with the drain of the switching NMOS transistor in another conducting unit in the conducting module, and the drain is configured to output the RF output signal or coupled with a source of a switching NMOS transistor in another conducting unit in the conducting module;
    a path resistance, comprising one end coupled with the drain of the switching NMOS transistor, and the other end coupled with the source of the switching NMOS transistor;
    a gate bias resistor, comprising one end coupled with the gate control voltage generating module and the other end coupled with a gate of the switching NMOS transistor; and
    a body bias resistor, comprising one end coupled with the body control voltage generating module and the other end coupled with a substrate of the switching NMOS transistor.

11. The RF switching circuit according to claim 9, wherein the conducting unit comprises:
    a switching NMOS transistor, comprising a drain and a source, wherein the drain is configured to receive an RF input signal or coupled with a source of a switching NMOS transistor in other conducting units in the conducting module, and the source outputs an RF output signal or coupled with a drain of the switching NMOS transistor in another conducting unit in the conducting module; or the source is configured to receive the RF input signal or coupled with the drain of the switching NMOS transistor in other conducting units in the conducting module, and the drain is configured to output the RF output signal or coupled with a source of a switching NMOS transistor in another conducting unit in the conducting module;
    a path resistance, comprising one end coupled with the drain of the switching NMOS transistor, and the other end coupled with the source of the switching NMOS transistor;
    a gate bias resistor, comprising one end coupled with the gate control voltage generating module and the other end coupled with a gate of the switching NMOS transistor; and
    a body bias diode, comprising a positive electrode coupled with a substrate of the switching NMOS transistor and a negative electrode coupled with the gate of the switching NMOS transistor.

12. The RF switching circuit according to claim 1, wherein the conducting module comprises a multi-stage of stack cascaded conducting units, and each conducting unit comprises a transistor.

13. The RF switching circuit according to claim 12, wherein the conducting unit comprises:
    a switching NMOS transistor, comprising a drain and a source, wherein the drain is configured to receive an RF input signal or coupled with a source of a switching NMOS transistor in another conducting unit in the conducting module, and the source is configured to output an RF output signal or coupled with a drain of the switching NMOS transistor in another conducting unit in the conducting module; or
    the source is configured to receive the RF input signal or coupled with the drain of the switching NMOS transistor in another conducting unit in the conducting module, and the drain is configured to output the RF output signal or coupled with a source of a switching NMOS transistor in another conducting unit in the conducting module;
    a path resistance, comprising one end coupled with the drain of the switching NMOS transistor, and the other end coupled with the source of the switching NMOS transistor;
    a gate bias resistor, comprising one end coupled with the gate control voltage generating module and the other end coupled with a gate of the switching NMOS transistor; and
    a body bias resistor, comprising one end coupled with the body control voltage generating module and the other end coupled with a substrate of the switching NMOS transistor.

14. The RF switching circuit according to claim 12, wherein the conducting unit comprises:
    a switching NMOS transistor, comprising a drain and a source, wherein the drain is configured to receive an RF input signal or coupled with a source of a switching NMOS transistor in other conducting units in the conducting module, and the source outputs an RF output signal or coupled with a drain of the switching NMOS transistor in another conducting unit in the conducting module; or the source is configured to receive the RF input signal or coupled with the drain of the switching NMOS transistor in other conducting units in the conducting module, and the drain is configured to output the RF output signal or coupled with a source of a switching NMOS transistor in another conducting unit in the conducting module;

a path resistance, comprising one end coupled with the drain of the switching NMOS transistor, and the other end coupled with the source of the switching NMOS transistor;

a gate bias resistor, comprising one end coupled with the gate control voltage generating module and the other end coupled with a gate of the switching NMOS transistor; and a body bias diode, comprising a positive electrode coupled with a substrate of the switching NMOS transistor and a negative electrode coupled with the gate of the switching NMOS transistor.

* * * * *